US009673084B2

United States Patent
Liu et al.

(10) Patent No.: US 9,673,084 B2
(45) Date of Patent: Jun. 6, 2017

(54) ISOLATION SCHEME FOR HIGH VOLTAGE DEVICE

(71) Applicant: GLOBALFOUNDRIES Singapore Pte. Ltd., Singapore (SG)

(72) Inventors: Kun Liu, Singapore (SG); Francis Benistant, Singapore (SG); Ming Li, Singapore (SG); Namchil Mun, Singapore (SG); Shiang Yang Ong, Singapore (SG); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/958,873

(22) Filed: Dec. 3, 2015

(65) Prior Publication Data
US 2016/0163583 A1    Jun. 9, 2016

Related U.S. Application Data

(60) Provisional application No. 62/087,247, filed on Dec. 4, 2014.

(51) Int. Cl.
| | |
|---|---|
| *H01L 21/762* | (2006.01) |
| *H01L 21/763* | (2006.01) |
| *H01L 29/06* | (2006.01) |
| *H01L 29/78* | (2006.01) |

(52) U.S. Cl.
CPC ...... *H01L 21/76229* (2013.01); *H01L 21/763* (2013.01); *H01L 21/76283* (2013.01); *H01L 29/0649* (2013.01); *H01L 29/0692* (2013.01); *H01L 29/78* (2013.01)

(58) Field of Classification Search
None
See application file for complete search history.

(56) References Cited

U.S. PATENT DOCUMENTS

| | | | | | |
|---|---|---|---|---|---|
| 4,583,282 | A | * | 4/1986 | Hulseweh | H01L 21/033 148/DIG. 117 |
| 4,963,957 | A | * | 10/1990 | Ohi | H01L 21/743 257/508 |

OTHER PUBLICATIONS

E. Ophir Arad et al., Junction Isolation for High Voltage Integrated Circuits, IEEE 27th Convention of Electrical and Electronics Engineers in Israel, 2012, pp. 1-4, IEEE, Israel.

(Continued)

*Primary Examiner* — Tucker J Wright
(74) *Attorney, Agent, or Firm* — Horizon IP Pte. Ltd.

(57) ABSTRACT

Semiconductor device isolation and method of forming thereof are presented. A base substrate with lightly doped first polarity type dopants is provided. A buried layer with heavily doped second polarity type dopants is formed in a top portion of the substrate while an epitaxial layer is formed over the buried layer. First and second type deep trench isolation (DTI) structures which extend from surface of the epitaxial layer to a portion of the base substrate are formed to isolate different device regions defined in the substrate. The first and second type DTI structures have different width dimensions. Shallow trench isolation (STI) regions are formed in the epitaxial layer and at least one transistor is formed on the epitaxial layer. The first and second type DTI structures effectively isolate the transistor from other device regions and enhances the breakdown voltage.

22 Claims, 11 Drawing Sheets

(56) References Cited

OTHER PUBLICATIONS

Prof Saraswat, Integrated Circuit Isolation Technologies, EE 311 Notes, retrieved on Dec. 21, 2016, pp. 1-28, Stanford, USA.
V. Parthasarathy et al., A 0.25 µm CMOS Based 70V Smart Power Technology with Deep Trench for High-Voltage Isolation, NXP, retrieved on Dec. 21, 2016, pp. 1-4, NXP, Tempe.

* cited by examiner

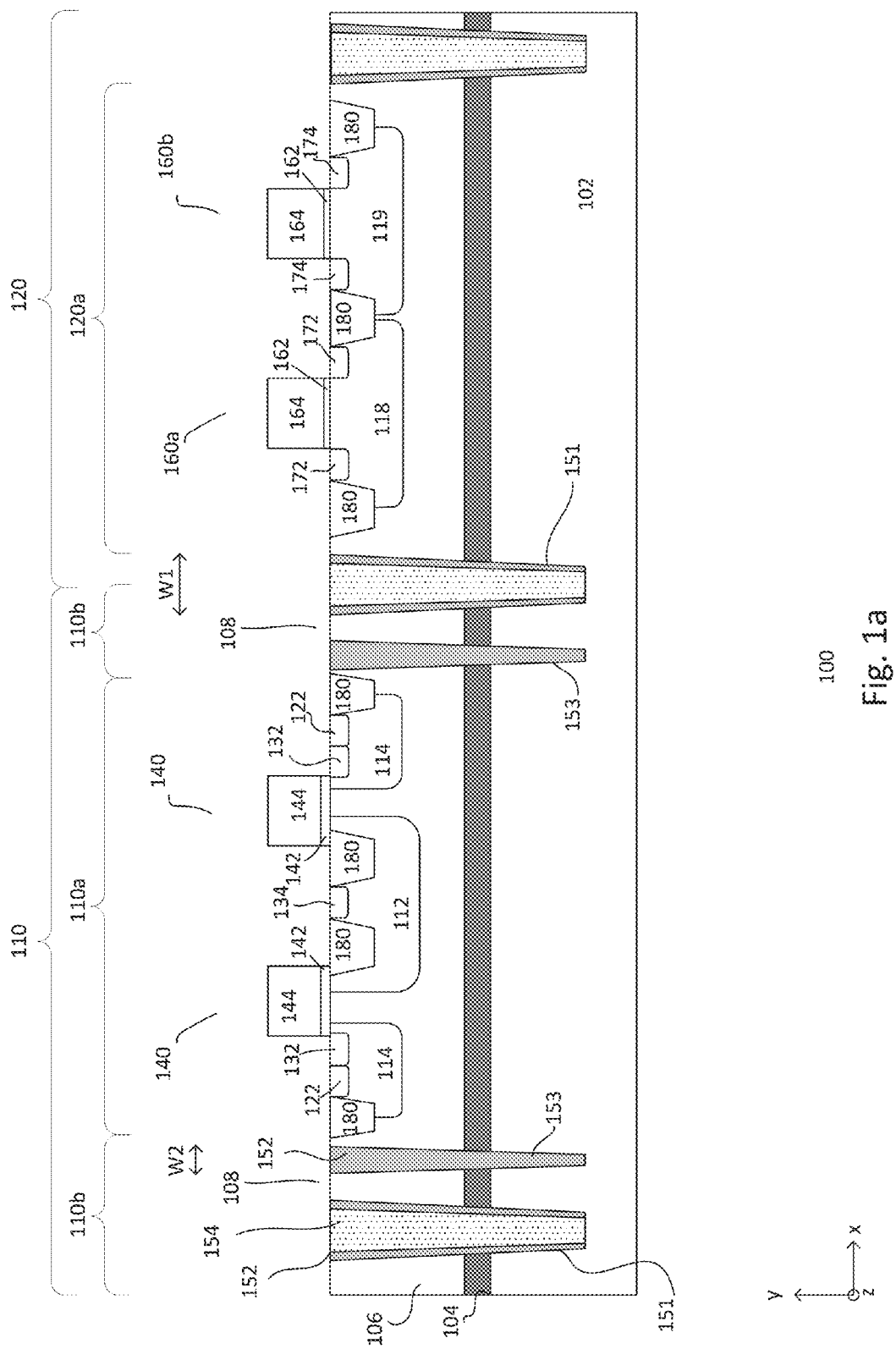

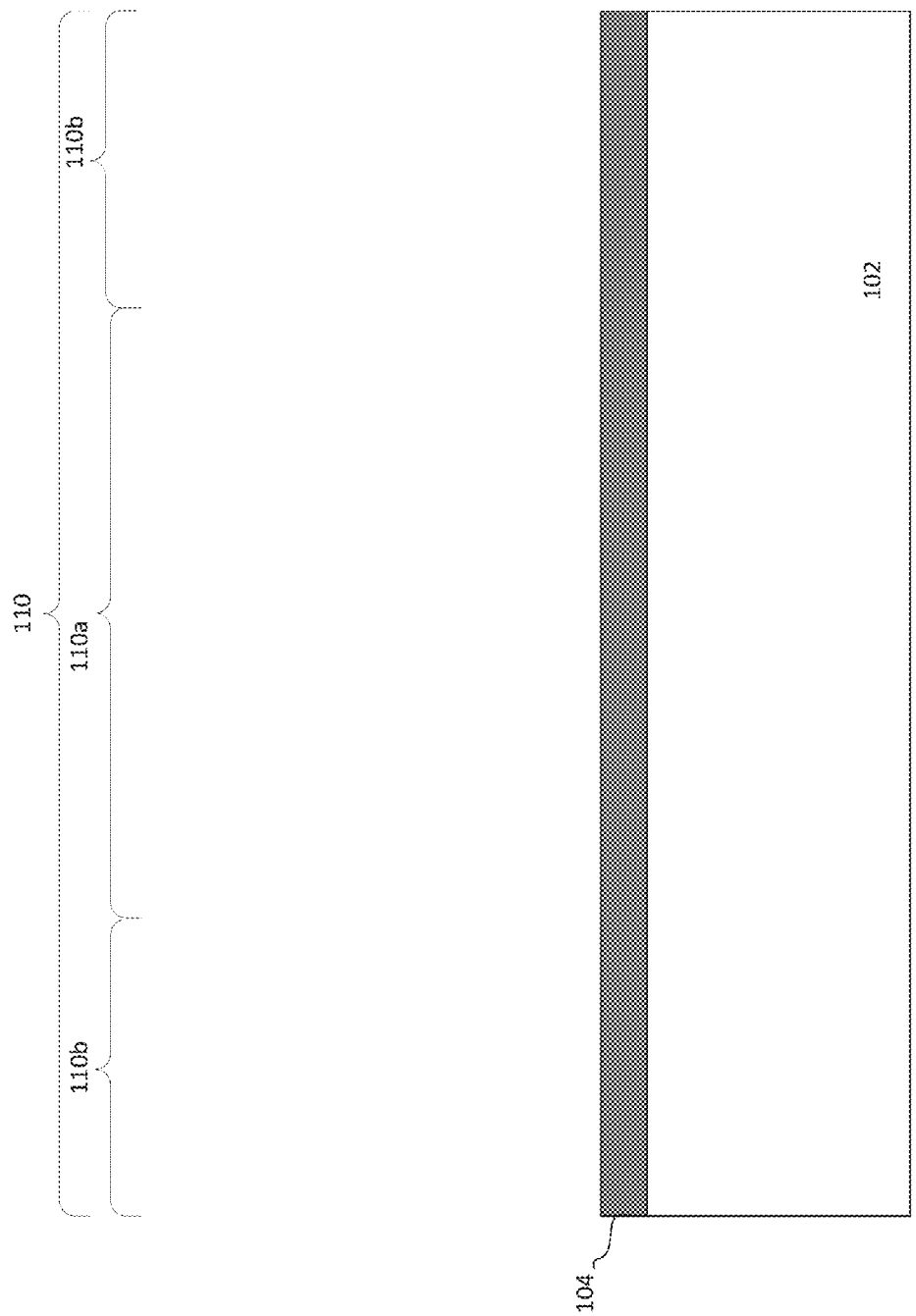

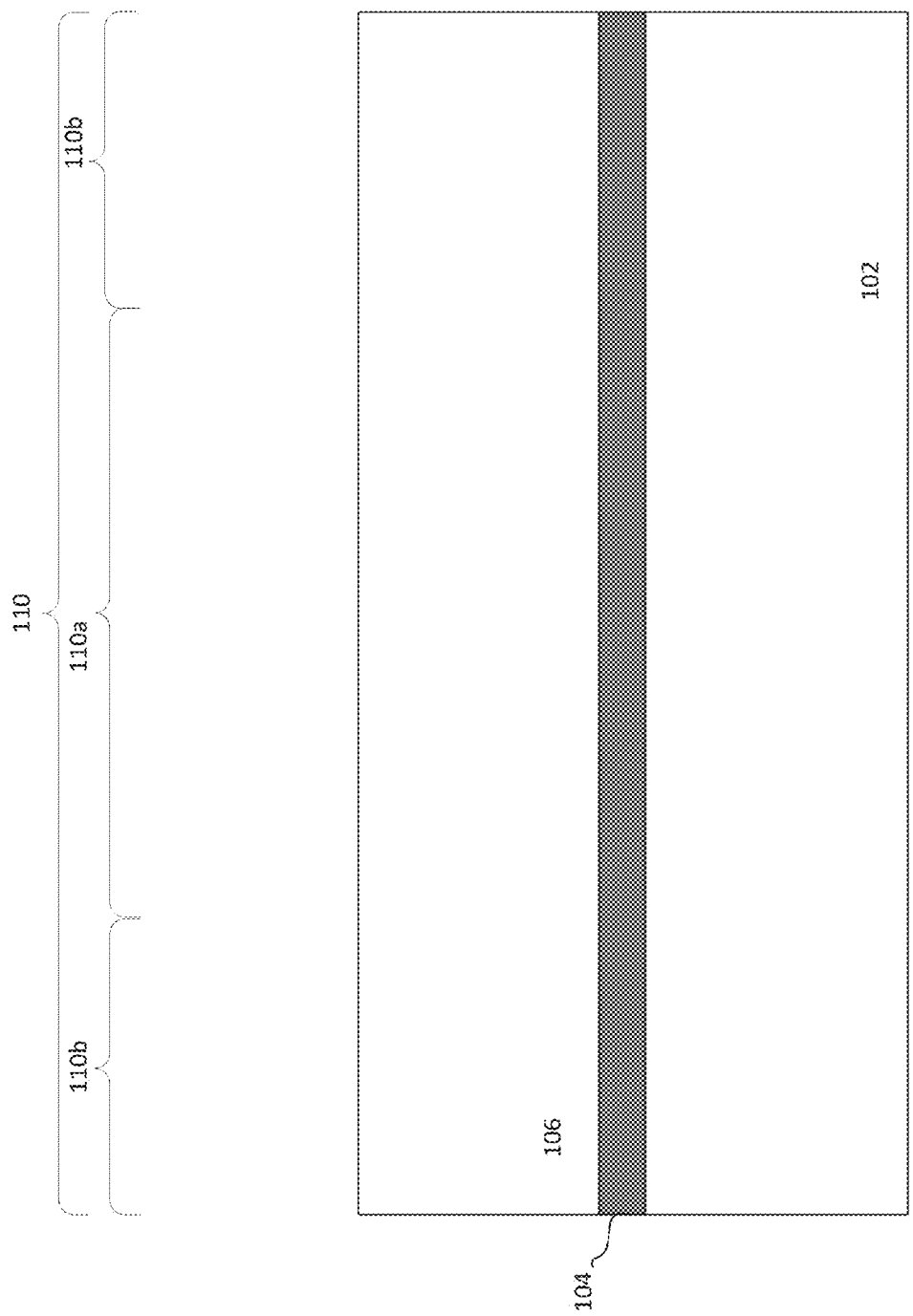

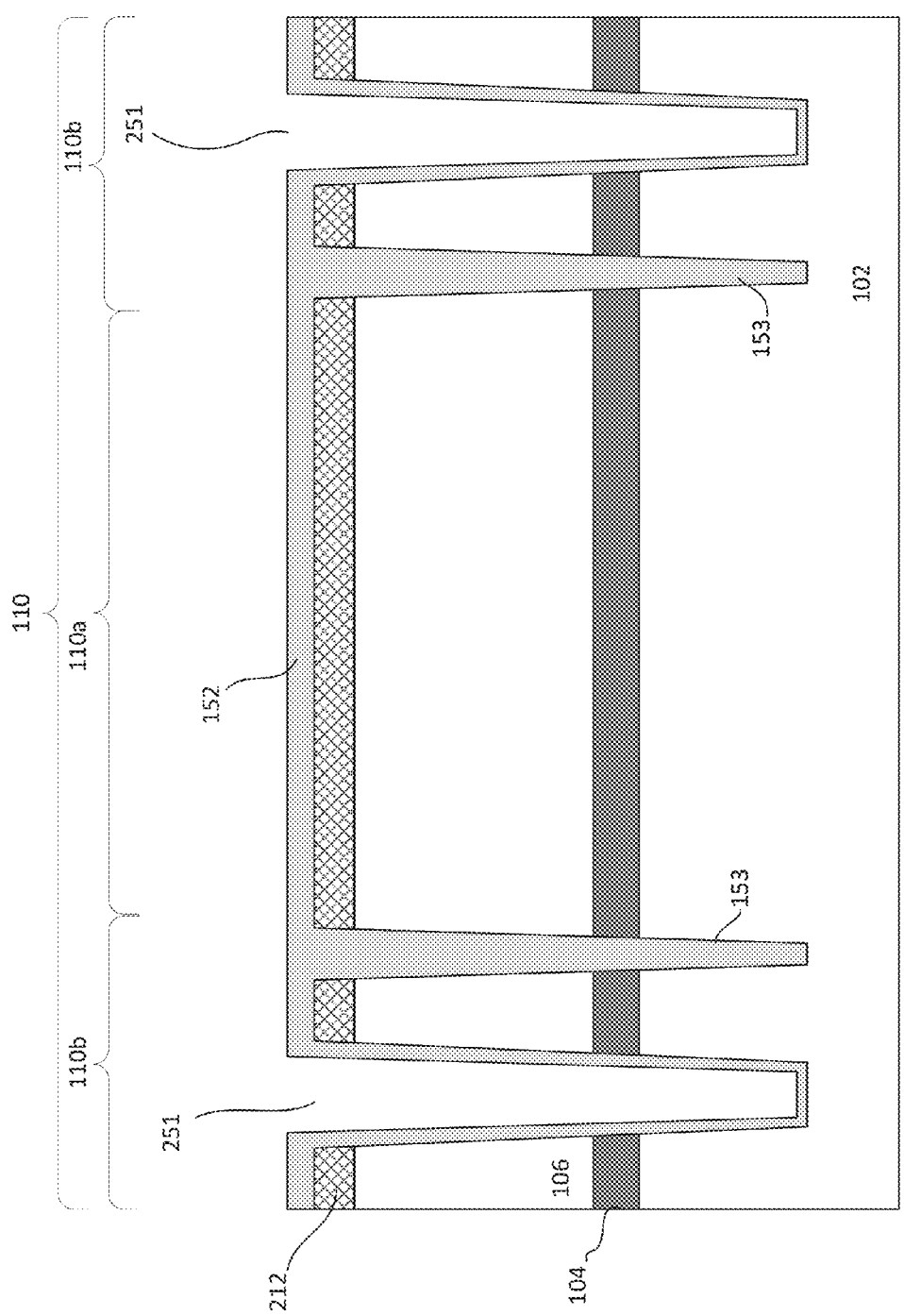

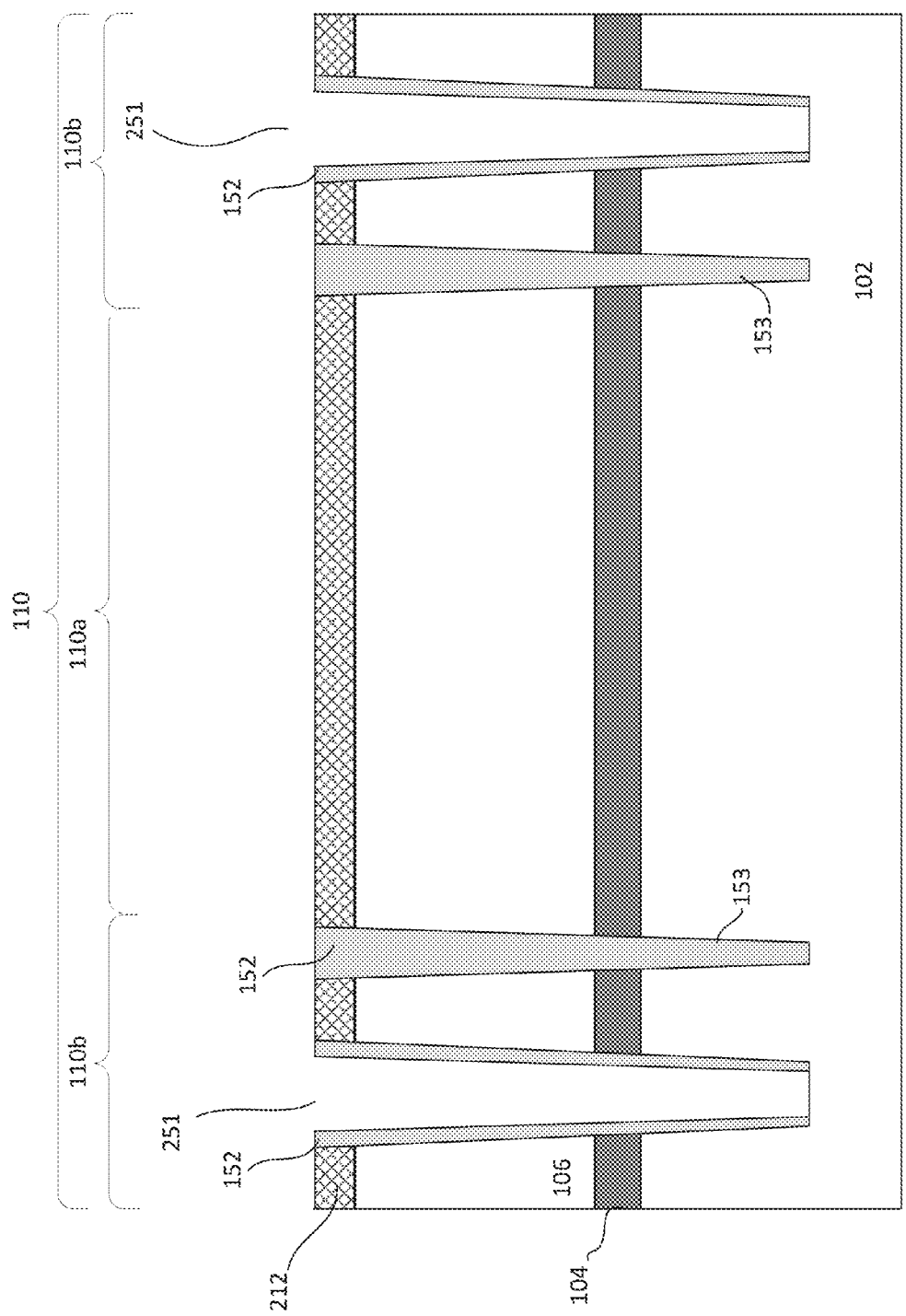

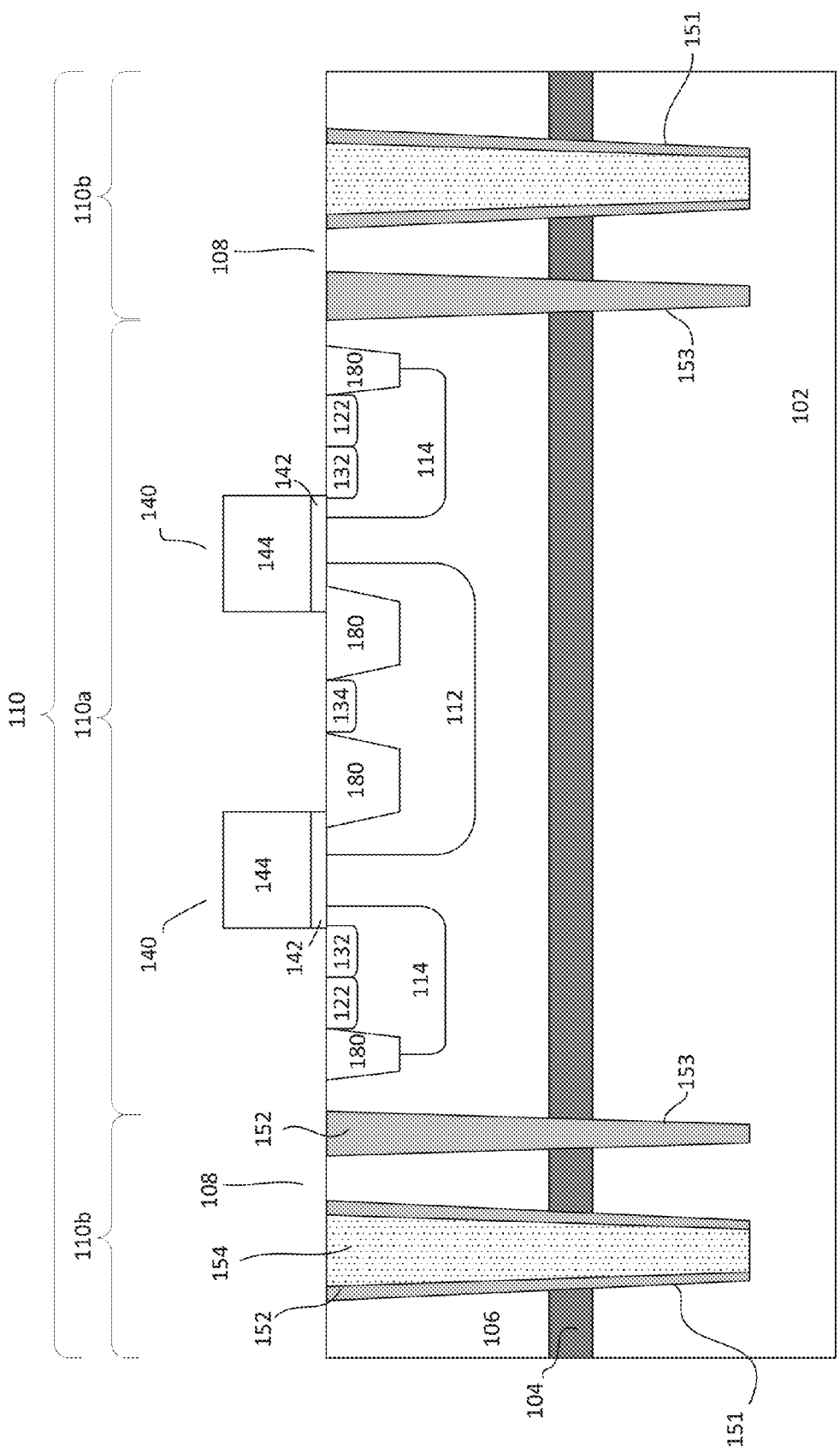

ISOLATION SCHEME FOR HIGH VOLTAGE DEVICE

CROSS-REFERENCE TO RELATED APPLICATION

This application claims the benefit of and priority to U.S. Provisional Patent Application No. 62/087,247, filed Dec. 4, 2014, which is hereby incorporated by reference in its entirety.

BACKGROUND

Bipolar CMOS DMOS (BCD) process technology enables incorporation of analog components, digital components and high voltage (HV) devices into a single chip or integrated circuit (IC) to form an embedded device. Such chip or IC is widely used in automotive and industrial applications. Nevertheless, it is difficult to integrate these different types of devices in a single die or chip since interference is prone to occur between the different devices. For example, high voltage devices may have latch up problem. This may undesirably affect the reliability of the overall product during integration. As such, there is a need to properly isolate the different types of devices from each other during integration. However, conventional junction isolation technique used for isolating the different types of devices consume larger layout area and require additional masking steps which may complicate the manufacturing process and increases the manufacturing cost. Moreover, the HV devices integrated with analog and digital components using conventional isolation scheme for isolation may not have the desired high breakdown voltage (BV) for high performance.

From the foregoing discussion, it is desirable to provide a reliable, high performing, simplified and cost effective solution to integrate various suitable isolation structures to effectively isolate HV devices from other devices in the same IC.

SUMMARY

Embodiments generally relate to semiconductor device isolation and method of forming thereof. In one embodiment, a method for forming a device is disclosed. The method includes providing a base substrate with lightly doped first polarity type dopants. A buried layer with heavily doped second polarity type dopants is formed in a top portion of the substrate. An epitaxial layer is formed over the buried layer. First and second type deep trench isolation (DTI) structures which extend from surface of the epitaxial layer to a portion of the base substrate are formed to isolate different device regions defined in the substrate. The first and second type DTI structures have different width dimensions. Shallow trench isolation (STI) regions are formed in the epitaxial layer and at least one transistor is formed on the epitaxial layer.

In another embodiment, a device is presented. The device includes a base substrate with lightly doped first polarity type dopants, a buried layer with heavily doped second polarity type dopants disposed in a top portion of the substrate and an epitaxial layer disposed over the buried layer. The device also includes first and second type deep trench isolation (DTI) structures disposed in the substrate. The first and second type DTI structures extend from surface of the epitaxial layer to a portion of the base substrate to isolate different device regions defined in the substrate and the first and second type DTI structures have different width dimensions. Shallow trench isolation (STI) regions are disposed in the epitaxial layer and at least one transistor is disposed on the epitaxial layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIG. 1a shows cross-sectional view of a portion of a device;

FIGS. 2a-2h show an embodiment of a process for forming a portion of a device.

DETAILED DESCRIPTION

Figure 1B:
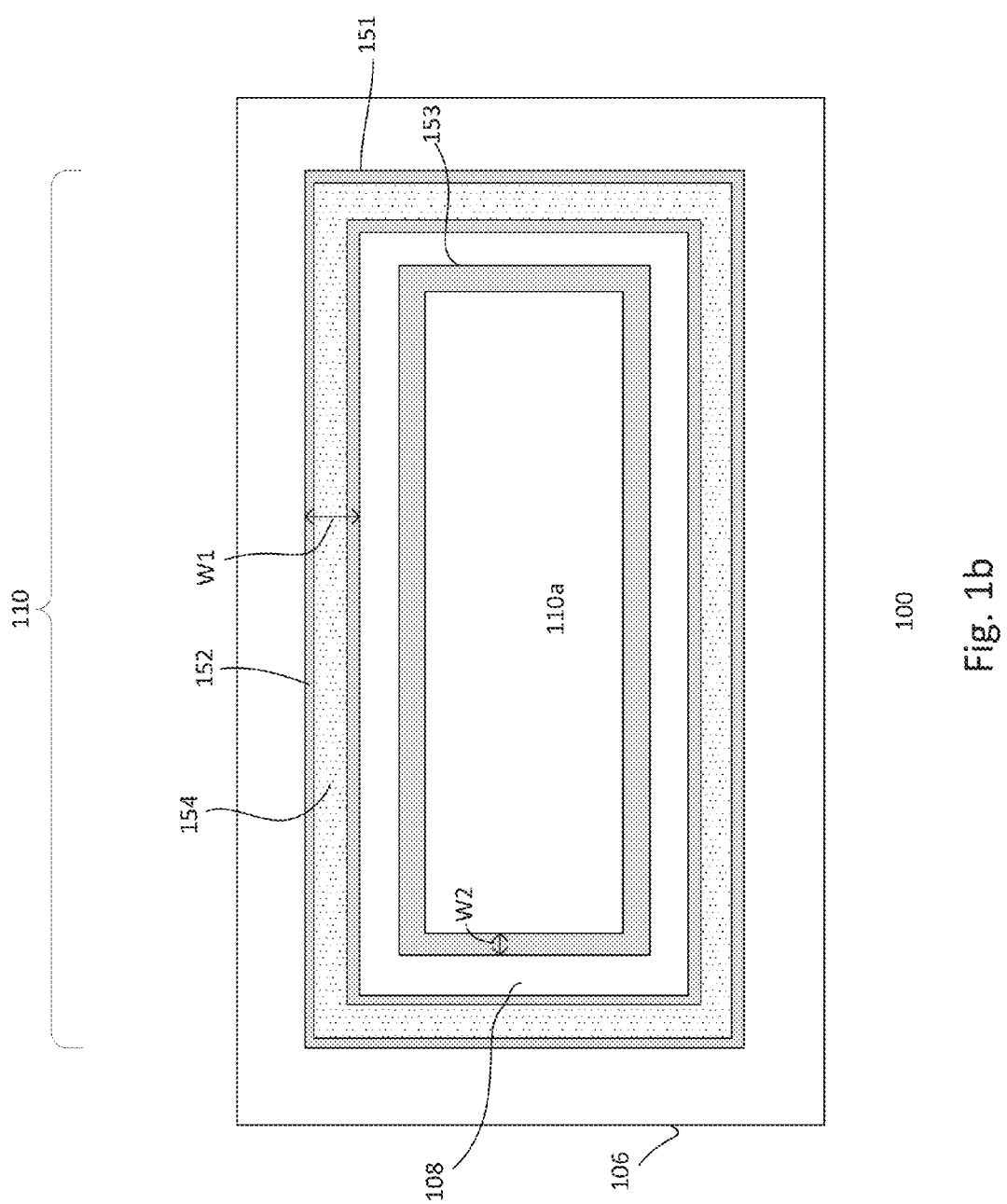
FIGS. 1b-1c show simplified top views of various embodiments of isolation structures disposed in a high voltage region of a device.

Embodiments generally relate to semiconductor devices or integrated circuits (ICs). More particularly, some embodiments relate to devices having high power devices integrated with other devices, such as logic and memory devices, on the same substrate. For example, high power devices include lateral double-diffused metal oxide semiconductor (LDMOS) transistors. Other suitable high power devices may also be useful. The high power devices can be employed as switching voltage regulators for power management applications. The embodiments in the present disclosure relates to providing first and second type deep trench isolation (DTI) structures or regions, together with buried layer, (e.g., N+ buried layer (NBL)) to effectively isolate the high power devices from the other devices in the same IC without requiring additional masking step. The first type DTI structure is configured to also serve as a pick up structure or substrate tap which provides low conductivity path to connect the substrate to upper metal interconnect while the second type DTI structure is configured to further isolate the HV devices from other regions and to increase the breakdown voltage. Such devices can be incorporated into ICs and easily integrated into logic processing technologies without compromising the reliabilities of the different devices. The devices or ICs can be incorporated into or used with, for example, consumer electronic products, standalone memory devices, such as USB or other types of portable storage units, or ICs, such as microcontrollers or system on chips (SoCs) or other suitable types of products.

FIG. 1a shows a cross-sectional view of a portion of an embodiment of a device 100. The device, for example, is an IC. Other types of devices may also be useful. As shown, the device includes a base substrate 102. The base substrate, for example, is a silicon substrate. Other suitable types of semiconductor substrates may also useful. The base substrate maybe a doped substrate. For example, the base substrate can be lightly doped with first polarity type dopants. The first polarity type dopants, for example, are p-type dopants. Providing a base substrate with other types of dopants or dopant concentrations as well as an undoped substrate, may also be useful.

The device may include doped regions having different dopant concentrations. For example, the device may include heavily doped ($x^+$), intermediately doped (x) and lightly doped (x) regions, where x is the polarity type which can be p or n. A lightly doped region may have a dopant concentration of about $1E14$-$1E16/cm^3$ and an intermediately doped region may have a dopant concentration of about $1E16$-$1E18/cm^3$, and a heavily doped region may have a dopant concentration of about $1E18$-$1E21/cm^3$. Providing other dopant concentrations for the different doped regions may also be useful. P-type dopants may include boron (B), aluminum (Al), indium (In) or a combination thereof, while n-type dopants may include phosphorous (P), arsenic (As), antimony (Sb) or a combination thereof.

A buried layer 104 is disposed in a top portion of the base substrate 102 which is doped with first polarity type dopants and an epitaxial layer 106 is disposed over the buried layer. The base substrate, the buried layer and the epitaxial layer may be referred to as the substrate of the device. The top surface of the epitaxial layer may be referred to as a top surface of the substrate. The buried layer 104, for example, is disposed in between the base substrate 102 and the epitaxial layer 106. The buried layer, for example, is a heavily doped region with second polarity type dopants for a first polarity type base substrate. For example, the buried layer is a n-type buried layer for a p-type base substrate. The buried layer 104 includes n-type dopants and the dopant concentration of the buried layer is higher than the dopant concentration of device wells disposed in the epitaxial layer. For example, the dopant concentration integration of the buried layer may be, for example, about $1E15$-$1E16/cm^2$. The depth of the buried layer is, for example, about 1-10 μm. Other suitable dopant concentration and depth dimensions for the buried layer may also be useful. The buried layer, for example, is used for high voltage device isolation to the first polarity type substrate 102. As for the epitaxial layer, it is provided as a second polarity type epitaxial layer. For example, the epitaxial layer is a n-type epitaxial layer grown on the n-type buried layer. Alternatively, the epitaxial layer is a p-type epitaxial layer grown on the n-type buried layer. The dopant concentration of the epitaxial layer 106 is higher than the dopant concentration of the base substrate 102. The dopant concentration of the epitaxial layer may be, for example, about $1E14$-$1E16/cm^3$. The thickness of the epitaxial layer is, for example, about 5-15 μm. Other suitable dopant concentration and thickness dimensions for the epitaxial layer may also be useful.

The substrate includes one or more device regions. For illustration purpose, the substrate is shown to include first and second device regions 110 and 120. The first device region 110, for example, is a high voltage (HV) device region for high voltage devices, such as HV transistors. The HV device region, in one embodiment, includes a first sub-region 110a for accommodating HV components and second sub-region 110b for accommodating DTI structures or regions. Other suitable number or types of regions or sub-regions may also be included in the HV device region. The first sub-region, for example, includes one or more second polarity type lateral double-diffused metal oxide semiconductor (LDMOS) transistor 140. For illustration purpose, first and second LDMOS transistors 140 are disposed in the first sub-region 110a. Other suitable number of LDMOS transistor and/or other suitable type of HV devices may be disposed in the first sub-region. The second polarity type LDMOS transistor, for example, is a LDNMOS transistor. In some cases, the LDMOS transistor may be first polarity type, such as a LDPMOS transistor. The first device region 110 is prepared for devices operating in high voltage ranges, for example, at a voltage of about 100V. Other suitable voltage values may also be useful.

Isolation regions may be provided for isolating or separating different doped regions in the epitaxial layer. In one embodiment, the different doped regions are isolated from each other by a shallow trench isolation (STI) region 180. A STI region includes an isolation trench filled with isolation or dielectric materials. Other suitable types of isolation regions may also be employed. The STI regions, for example, extend to a depth shallower than the bottom of the epitaxial layer. For example, the depth of the STI region is, for example, about 2000-5000 Å from the top surface of the substrate. Providing isolation regions which extend to other suitable depths may also be useful.

As described, the HV transistors, for example, include LDMOS transistors. Other suitable types of HV transistors may also be useful. For illustration purpose, LDMOS transistors are described herein. A LDMOS transistor 140 includes a gate on the surface of the substrate. The gate, for example, traverses the device region along the z direction. The width of the gate along a channel length direction of the transistor may be, for example, about 2-150 μm. As shown, the channel direction is in the x direction. The x and z directions, for example, are orthogonal directions. The gate, in one embodiment, includes a gate electrode 144 over a gate dielectric 142. The gate dielectric, for example, may be silicon oxide while the gate electrode may be polysilicon. The gate dielectric may be a high voltage gate dielectric having a thickness of, for example, about 60-1000 Å while the thickness of the gate electrode may be, for example, about 700-5000 Å. In some embodiments, the gate electrode may be a doped electrode. For example, n-type dopants may be used to dope the gate electrode of NMOS transistor while p-type dopants may be used to dope the gate electrode of PMOS transistor. Other suitable types of gate dielectrics and gate electrodes as well as thicknesses may also be useful.

The LDMOS transistor also includes first and second doped regions disposed in the substrate on first and second sides of the gate. For example, the first doped region is disposed on the first side of the gate and the second doped region is disposed on the second side of the gate. For a first type LDMOS transistor, the doped regions, in one embodiment, are heavily doped with first polarity type dopants. As for a second type LDMOS transistor, the doped regions, in one embodiment, are heavily doped with second polarity type dopants. For example, the LDMOS transistor 140 in the first sub-region is a LDNMOS transistor. Thus, the first and second doped regions 132 and 134 are heavily doped n-type ($n^+$) regions. In the case where the LDMOS transistor 140 is a LDPMOS, the first and second doped regions 132 and 134 are heavily doped p-type ($p^+$) regions. The heavily doped regions, for example, have a dopant concentration of, for example, about $1E18$-$1E21/cm^3$. Other suitable dopant concentrations for the doped regions may also be useful. The depth of the doped regions may be, for example, about 0.1-0.4 μm from the top surface of the substrate. Providing doped regions having other suitable depths may also be useful. Additionally, it is not necessary that the first and second doped regions have the same depth.

In one embodiment, the first doped region 132 of a LDMOS transistor serves as a source region while the second doped region 134 serves as a drain region. The source region 132 is adjacent to the first side and underlaps the gate. The underlap portion should be sufficient for the source region to be in communication with the channel under the gate. The drain region 134 is adjacent to the second side of the gate and is displaced away from the second side of the gate by an internal isolation region 180.

Sidewalls of the gate may be provided with dielectric spacers (not shown). The dielectric spacers, for example, may be silicon oxide spacers. Other suitable types of dielectric materials may also be useful, such as silicon nitride or a combination of dielectric materials or layers. For example, the spacers may be composite spacers. The spacers may include an offset spacer and main spacer. The offset spacers may facilitate forming lightly doped diffusion regions (not shown) while the main spacers facilitate forming heavily doped source regions. Other configurations of spacers may also be useful. For example, the spacer may be a single spacer. In some cases, the LDMOS transistor may include a halo region. The halo region is a doped region having dopants of opposite polarity type than that of the first and second doped regions 132 and 134. The halo region, for example, abuts the source region proximate to the gate.

In one embodiment, an internal isolation region 180 is provided within the first sub-region of the HV device region. The internal isolation region may be a STI region. Other suitable types of isolation regions may also be useful. The internal isolation region, for example, is disposed in the first sub-region along the z direction in between the gate and drain 134. The internal isolation region, for example, extends from one side to the other side of the device region along the z direction. Other configurations of the internal isolation region may also be useful. As shown, the internal isolation region underlaps the gate and displaces the drain 134 away from the second side of the gate. For example, the internal isolation region extends under the second side of the gate by suitable dimension. Providing the internal isolation region which underlaps the gate protects the edge of the gate dielectric from high electric field during operation. The width of the internal isolation region, for example, may be about 0.2-10 µm. Other suitable widths may also be useful, depending on the drain voltage. The width and depth of the internal isolation region may determine a drift length of the LDMOS transistor.

A drift well 112 is disposed in first sub-region of the HV device region. For example, the drift well 112 is disposed between the gate and the drain region, under-lapping a portion of the gate. As shown, the drift well encompasses the drain and the internal device isolation region. In one embodiment, the depth or bottom of the drift well is below the drain region. In one embodiment, the depth or bottom of the drift well is below the STI and internal device isolation regions. In one embodiment, the drift well is contiguous and encompasses the drain region and at least overlaps a portion of the active region underneath the gate. The distance from the drain and around the internal isolation region to the channel under the gate is the drift distance of the transistor.

The drift well includes the same polarity type dopants as the type of the transistor. For example, the drift well 112 in the first sub-region 110a includes second polarity type dopants, such as n-type dopants for LDNMOS. In one embodiment, the dopant concentration of the drift well is lower than the dopant concentration of the drain. In one embodiment, the drift well may be lightly (x) or intermediately (x) doped with suitable polarity type dopants. For example, the dopant concentration of the drift well is, for example, about 1E15-1E18/Other suitable dopant concentrations may also be useful. For example, the dopant concentration may depend on the maximum or breakdown voltage requirement of the device. The depth of the drift well may be, for example, about 0.5-5 µm depending on the design voltage of the device. As shown, the first and second LDMOS transistors 140 share a common drain 134 and a common drift well. It is understood that the first and second LDMOS transistors may be provided with separate drift wells and drains.

Device or transistor wells 114 may be disposed in the first sub-region 110a. A device well, for example, serves as a body for a LDMOS transistor. The device well may be lightly (x) or intermediately (x) doped with opposite polarity type of dopants than that of the type of the transistor. The device well 114, for example, includes p-type dopants for a n-type transistor or includes n-type dopants for a p-type transistor. The dopant concentration of the device well is, for example, about $1E15$-$1E18/cm^3$. Other suitable dopant concentration for the device well, for example, dopant concentration greater than that of the lightly doped substrate, may also be useful. A depth of the device well, as shown, is shallower or deeper than the depth of the drift well. In some cases, the device well may be part of the epitaxial layer 106 of substrate. For example, a first polarity type doped epitaxial layer may serve as the device well. Other configurations of device wells may also be useful.

The device or transistor wells, for example, are provided with well contacts or tap regions 122 respectively for biasing the wells. The well contacts are heavily doped regions, similar to source/drain (S/D) regions. For example, a depth of the well contact is shallower than a depth of the STI region and the well contacts are in communication with the respective wells. The dopant concentration of the well contacts may be, for example, about $1E18$-$1E21/cm^3$. The well contacts have the same polarity type as the device wells. For example, the well contact 122 include p-type dopants for a p-type device well or include n-type dopants for n-type device well.

As described, the substrate as shown in FIG. 1a also includes a second device region 120. The second device region 120, for example, may serve as a low voltage (LV) or medium voltage (MV) device region. In the case whether the second device region is a LV device region, it is suitable for accommodating LV transistors while in the case where the second device region is a MV device region, it is suitable for accommodating MV transistors. The second device region, in one embodiment, includes a region 120a for accommodating LV or MV components.

As shown, the second device region includes first and second transistor regions for accommodating first and second transistors 160a and 160b. Isolation regions 180, such as STI regions, are disposed to isolate the first and second transistors in the second device region. The first and second transistor regions include first and second transistor wells 118 and 119 for first and second transistors 160a and 160b. The transistor wells, for example, are intermediately doped with opposite polarity type of dopants than that of the type of transistor. The transistor well serves as body of a LV or MV transistor.

A LV or MV transistor includes a gate having a gate electrode 164 and a gate dielectric 162. The gate dielectric 162, for example, includes a thickness which is similar as or thinner than the thickness of the gate dielectric 142 of the HV transistors. The thickness of the gate dielectric may vary, depending on whether the transistors are LV transistors or MV transistors. The gate dielectric may be formed of silicon oxide and the gate electrode may be formed of polysilicon. Providing other types of gate dielectric and gate electrode materials may also be useful. A transistor includes first and second S/D regions adjacent to first and second sides of the gate. For example, the first transistor 160a includes first and second S/D regions 172 disposed adjacent to the sides of its gate and the second transistor 160b includes first and second S/D regions 174 disposed adjacent to the sides of its gate. The S/D regions are heavily doped regions. The transistors may also include lightly doped drain (LDD) regions (not shown).

Gate dielectric sidewall spacers (not shown) may be disposed on the gate sidewalls. The spacers, for example, include silicon oxide. Other types of materials may also be used. For example, the spacers may be a silicon nitride or multiple layers of dielectric materials, such as silicon oxide and silicon nitride. A channel of the transistor is located in the substrate under the gate between the S/D regions.

In one embodiment, the first and second transistors 160a and 160b are opposite polarity type transistors, forming a complementary metal oxide semiconductor (CMOS) transistors. For example, the first transistor 160a is a first polarity type transistor and the second transistor 160b is a second polarity type transistor. The first polarity type may be p-type and the second polarity type may be n-type. For example, the n-type transistor includes n-type S/D regions and p-type transistor well while the p-type transistor includes p-type S/D regions and n-type transistor well. The S/D regions of the LV or MV transistors may be similar to the source and drain regions of the HV transistors while the transistor wells of the LV or MV transistors may be similar to the device or transistor wells of the HV transistors.

In one embodiment, first type deep trench isolation (DTI) structure or region 151 and second type DTI structure or region 153 are provided in the first (or HV) device region while first type DTI structure 151 is disposed in the second (or LV/MV) device region of the substrate. In one embodiment, the first type DTI structures 151 are provided for isolating or separating different device regions of the substrate. For example, the first type DTI structure 151 is provided to isolate the first device region 110 from the second device region 120. The first type DTI structure 151, for example, is provided to isolate the HV device region from the LV or MV device region. The first type DTI structure 151 provides lateral isolation of each device region. In one embodiment, the first type DTI structure extends from the top surface of the epitaxial layer 106 and extends into a portion of the first polarity type base substrate 102. The bottom of the first type DTI structure, for example, is below a top surface of the first polarity type base substrate 102. The first type DTI structure extends to a depth D1 from the top surface of the epitaxial layer. For example, D1 is about 10~30 μm deep from the top surface of the epitaxial layer. The first type DTI structure has a width W1 of about 2~3 μm when viewed from top of the substrate. Other suitable depth and width dimensions for the first type DTI structure may also be useful.

The sidewalls of the first type DTI structure 151 are lined with a dielectric layer 152 and the first type DTI structure is filled with a conducting material 154. In one embodiment, the dielectric layer lining sidewalls of the first type DTI structure includes silicon oxide while the conducting material includes highly p-type doped polysilicon. The first type DTI structure with highly p-type doped polysilicon, as shown, can connect with the first polarity type or p-type base substrate 102 with low resistivity and to serve as pick up structure or substrate tap on silicon surface.

In one embodiment, second type DTI structure 153 is disposed in the first device region 110 of the substrate. For example, the second type DTI structure is disposed in the second sub-region 110b of the HV device region. In one embodiment, the second type DTI structure 153 is provided to enhance isolation of the HV devices from other devices. In one embodiment, the second type DTI structure 153 extends from the top surface of the epitaxial layer 106 and extends into a portion of the first polarity type base substrate 102. The bottom of the second type DTI structure, for example, is below a top surface of the first polarity type substrate 102. The second type DTI structure extends to a depth D2 from the top surface of the epitaxial layer. As shown, the depth D2 is about the same as the depth D1 of the first type DTI structure. Other suitable depth dimensions may also be useful. In other embodiments, the depth D2 of the second type DTI structures may be different than that the depth D1 of the first type DTI structures. For example, D2 may be shallower than D1. In one embodiment, the second type DTI structure 153 includes a width W2 which is lesser than the width W1 of the first type DTI structure 151 when viewed from top. The width W2, for example, is in between the minimum critical dimension (CD) achievable by photolithography and the width W1 of first type DTI structure. For example, the width W2 is about 0.5~2 μm Other suitable width dimensions which are less than W1 may also be useful as long as it can create a depth extends into a portion of the base substrate and is able to be completely filled with the dielectric material to provide additional isolation for the HV device.

The second type DTI structure 153 is filled with a dielectric material. In one embodiment, the second type DTI structure 153 is filled with the same dielectric material 152 which is used to line the sidewalls of the first type DTI structure 151. For example, the second type DTI structure is filled with silicon oxide. In other embodiments, the second type DTI structure may be filled with other suitable types of dielectric material which is different than the dielectric layer lining the sidewalls of the first type DTI structures.

As described, the first and second type DTI structures extend from the top surface of the substrate or epitaxial layer and pass through the epitaxial layer 106, the buried layer 104 and into a portion of the base substrate 102. The second type DTI structure 153 is disposed in the second sub-region of the HV device region and is separated from the first type DTI structure 151 by a distance of, for example, about 2~3 μm. Other suitable separation distance between the first and second type DTI structures may also be useful, depending on the photoresist layer which remains for the DTI trench etch (preferably the smaller the better) and sufficiently wide to be sustainable during the DTI trench etch. The separation region between the first and second type DTI structures may be referred to as a floating region 108.

Figure 1C:
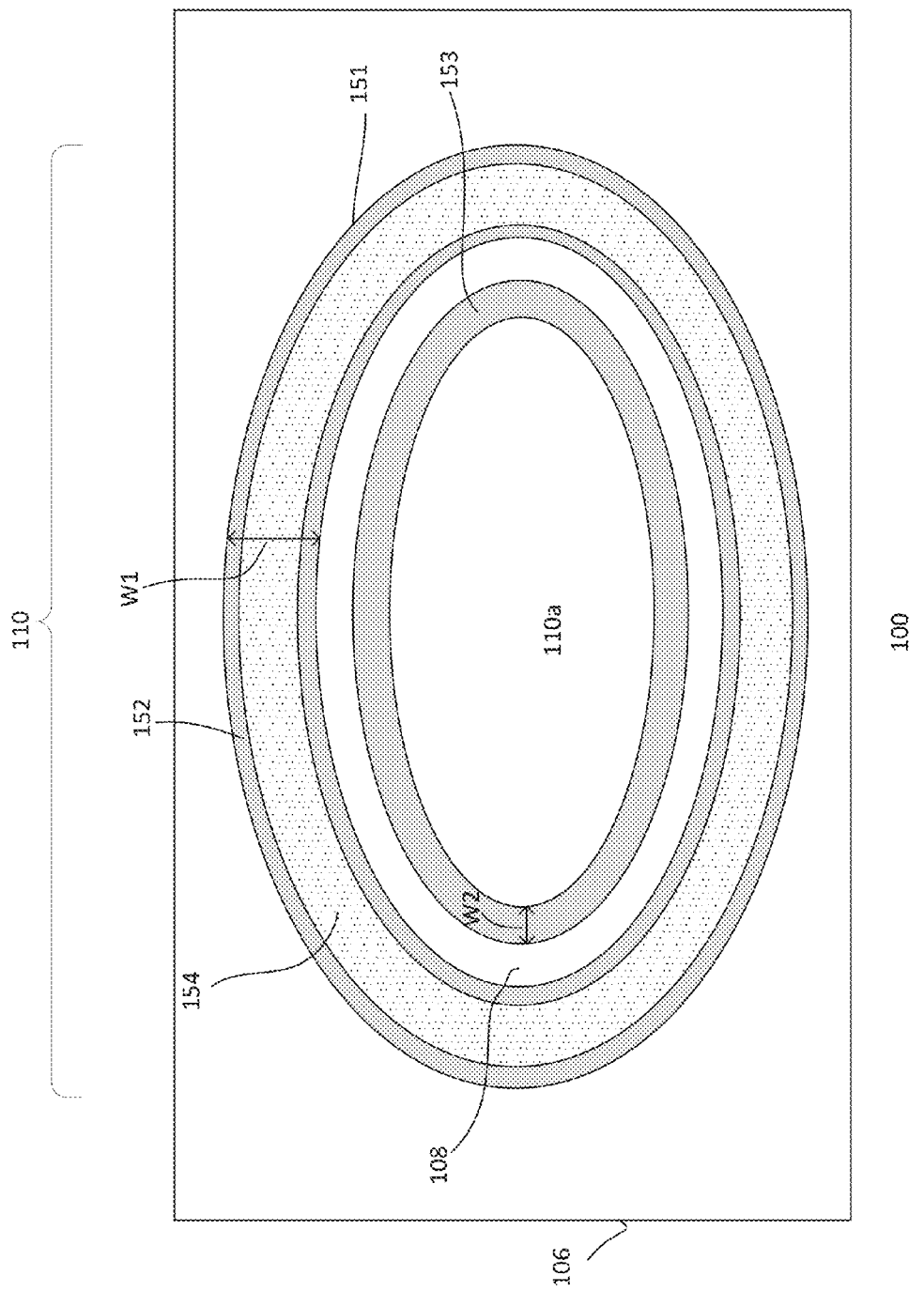

FIGS. 1b and 1c show various configurations of the first and second type DTI structures in the first device region 110 when viewed from top. In one embodiment, the first and second type DTI structures are disposed in the first device region 110. The first sub-region 110a which accommodates one or more HV transistors (not shown) is disposed in the center of the first device region 110 and the DTI structures are disposed concentrically outwards. In one embodiment, the second type DTI structure 153 is disposed in between the first sub-region 110a and the first type DTI structure 151. As shown, the second type DTI structure surrounds the first sub-region while the first type DTI structure is disposed in the outermost region and surrounds the second type DTI structure. Thus, the first sub-region is the inner most region in the first device region and the second type DTI region and the first type DTI region extending outwards concentrically in sequence. The first and second type DTI structures are separated from each other by the floating region 108. The width W2 of the second type DTI structure is less than the width W1 of the first type DTI structure. In one embodiment, the first and second type DTI structures form a substantially rectangular concentric ring structures or regions when viewed from top as shown in FIG. 1b. In another embodiment, the first and second type DTI structures form a substantially circular or oval concentric ring structures when viewed from top as shown in FIG. 1c. Other configurations for the first and second type DTI structures may also be useful.

Metal silicide contacts may be provided on terminals or contact regions of the LDMOS transistors in the HV device region and LV or MV transistors in the second device region. For example, metal silicide contacts may be provided on the gate electrode, S/D regions and well contacts. The silicide contacts, for example, may be nickel-based silicide contacts. Other suitable types of metal silicide contacts may also be useful. For example, the metal silicide contact may be cobalt silicide (CoSi). The silicide contacts may be, for example, about 50-300 Å thick. Other suitable thickness of silicide contacts may also be useful. The silicide contacts may be employed to reduce contact resistance and facilitate contact to the back-end-of-line metal interconnects.

A dielectric layer (not shown) is disposed on the substrate, covering the transistors and top of the substrate. The dielectric layer, in one embodiment, serves as a pre-metal dielectric (PMD) layer. The dielectric layer, for example, is a silicon oxide layer. In one embodiment, the dielectric layer is a high aspect ratio process (HARP) dielectric material. Other suitable types of dielectric materials are also useful. For example, the dielectric layer can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG).

The PMD layer includes via contacts or contact plugs (not shown) coupled to the contact regions of the transistors. For example, contacts plugs are provided in the PMD layer to the gate electrode (not shown), S/D regions and well contacts. The contact plugs, for example, may be tungsten contact plugs. Other suitable types of conductive contact plugs may also be useful.

An inter-metal dielectric (IMD) layer (not shown) may be provided over the PMD layer. The IMD layer, for example, may be silicon oxide. Other types of IMD dielectric materials may also be useful. An etch stop layer may be provided between the IMD and PMD layers. The IMD layer may include conductive lines disposed in the IMD layer which interconnect to the contact plugs. Other configurations of IMD and PMD layers may also be useful.

Figure 2C:
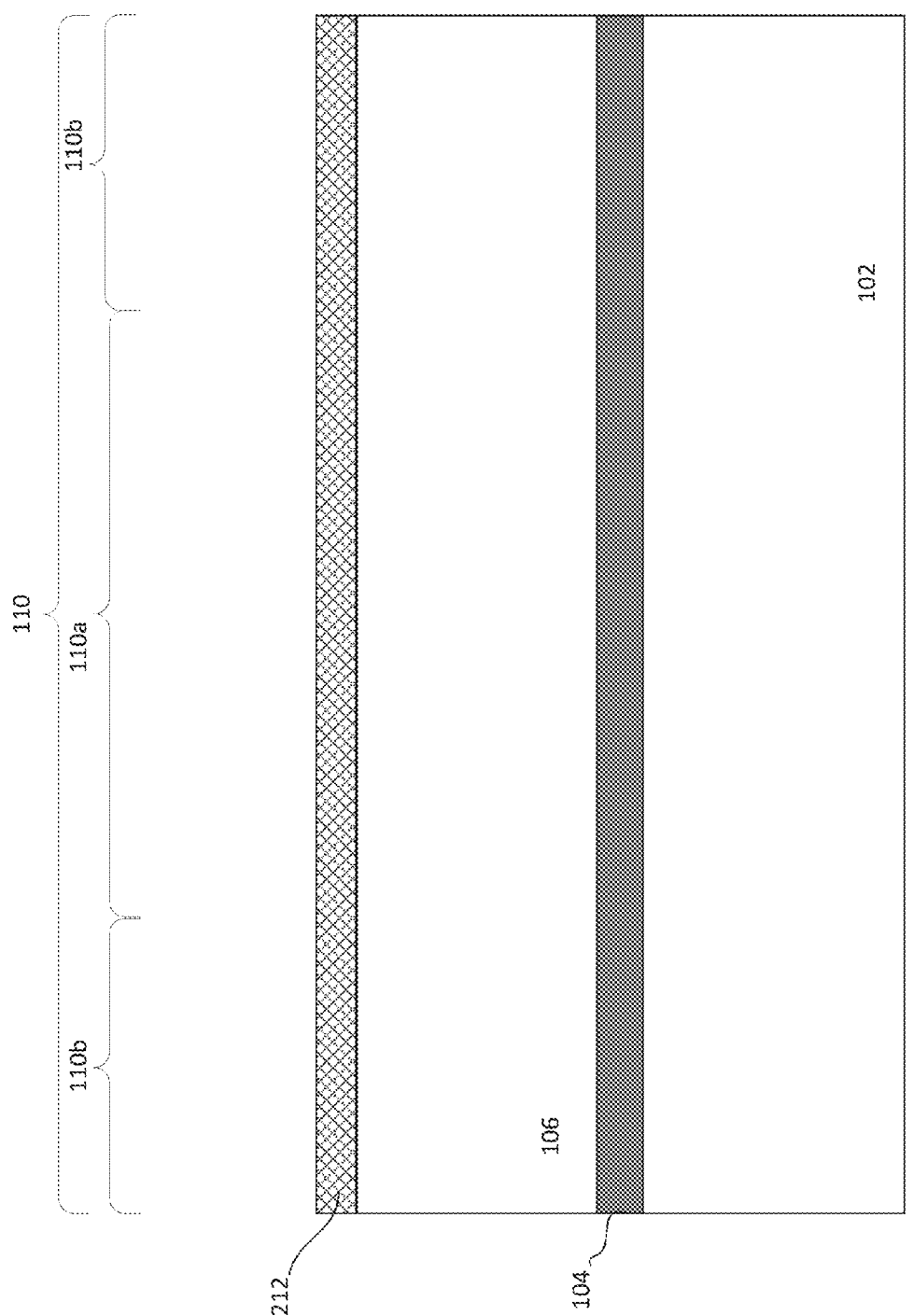

FIGS. 2a-2h show cross-sectional views of an embodiment of a process for forming a device 200. The device, for example, is similar to the device 100 as described in FIG. 1a. As such, common elements may not be described or described in detail. Referring to FIG. 2a, a base substrate 102 is provided. The base substrate, in one embodiment, is a silicon substrate. The base substrate may be a doped substrate, such as a lightly doped p-type substrate. Other suitable types of semiconductor substrate may also be useful. The base substrate may be doped with other types of dopants or dopant concentrations, including undoped substrate.

As shown, at least one device region is defined on the substrate. Although one device region is shown, it is however understood that the substrate may include various types of regions (not shown). For example, the substrate may include other device regions for other types of circuitries or devices. Depending on the type of IC formed, the other device regions, for example, may include regions for different voltage devices and for other types of devices. For example, the other device regions may include MV regions for MV devices and LV regions for LV devices and array regions. Other suitable types of device regions may also be provided.

For simplicity and illustration purpose, only one device region 110 is shown. In one embodiment, the device region 110 is a HV device region. The device region, for example, serves as a device region for high voltage transistors. The HV device region, in one embodiment, includes first sub-region 110a and second sub-region 110b. Other suitable number or types of regions or sub-regions may also be included in the HV device region. For illustration purpose, the high voltage transistors, for example, include LDMOS transistors. Other suitable types of high voltage transistors may also be useful. As an example, the first sub-region 110a is suitable for accommodating HV components and the second sub-region 110b is suitable for accommodating DTI structures. The first sub-region is prepared for devices operating in high voltage ranges, for example, at a voltage of about 100 V. Other suitable voltage values may also be useful.

Referring to FIG. 2a, a buried layer 104 is formed in a top portion of the substrate 102. For example, an ion implantation process which includes a blanket second polarity type ion implantation is performed to form a substantially continuous second polarity type buried layer 104 in top portion of the base substrate 102. The buried layer, for example, is a heavily doped region with second polarity type dopants for a first polarity type base substrate. For example, the buried layer is a n-type buried layer for a p-type base substrate. For example, antimony is used to form the heavily doped n-type (N+) buried layer by implanting with a dose range of about 1E15-1E16/cm$^2$ at energy of about 50-200 KeV. Other suitable implant parameters may also be useful. The depth of the buried layer is, for example, about 1-10 μm. Other suitable depth dimensions may also be useful.

The process continues by growing an epitaxial layer 106 over the buried layer as shown in FIG. 2b. The base substrate, the buried layer and the epitaxial layer may be referred to as the substrate of the device. The top surface of the epitaxial layer may be referred to as a top surface of the substrate. The epitaxial layer, in one embodiment, is a second polarity type epitaxial layer. For example, the epitaxial layer is a n-type epitaxial layer grown on the n-type buried layer. In an alternate embodiment, the epitaxial layer is a first polarity type epitaxial layer, such as p-type epitaxial layer grown on the n-type buried layer. The dopant concentration of the epitaxial layer is higher than the dopant concentration of the substrate. For example, the dopant concentration of the epitaxial layer may be, for example, about 1E14-1E16/cm$^3$. The thickness of the epitaxial layer is, for example, about 5-15 μm. Other suitable dopant concentration and thickness dimensions for the epitaxial layer may also be useful.

In one embodiment, the process continues to form first and second type DTI regions or structures. A hard mask layer 212 is formed on the top surface of the epitaxial layer as shown in FIG. 2c. The hard mask layer is used to pattern the substrate. The hard mask may be a silicon nitride hard mask. In one embodiment, the hard mask may be a hard mask stack. For example, the hard mask may include a pad oxide on the substrate and a silicon nitride layer over it. The pad oxide, for example, is formed by thermal oxidation while the nitride layer is formed by chemical vapor deposition (CVD). The pad nitride or upper layer of the mask stack serves as the mask while the pad oxide promotes adhesion of the upper layer to the substrate. Other suitable configurations of hard mask or hard mask stacks may also be useful.

Figure 2D:
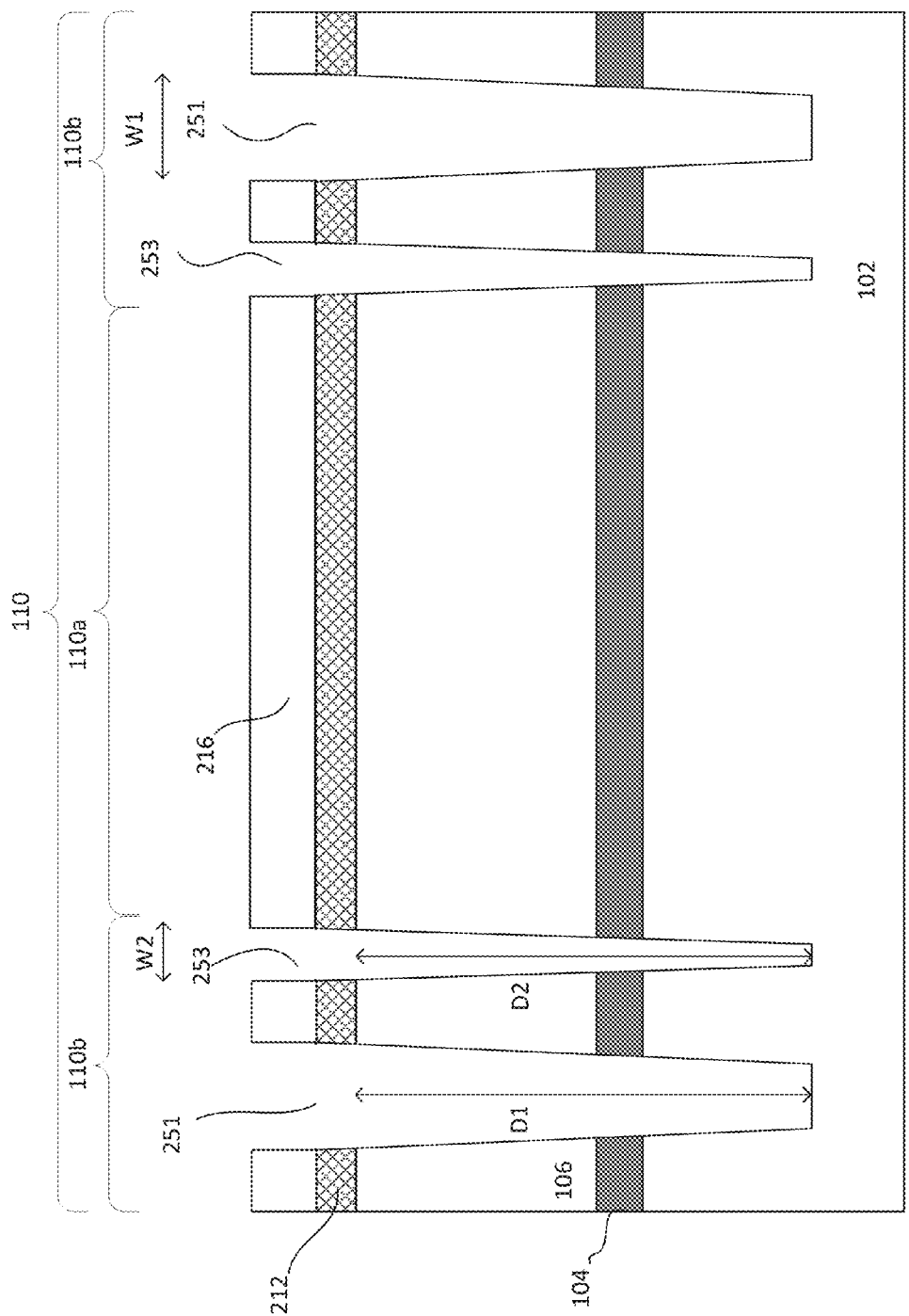

A soft mask layer 216 is formed on the hard mask 212 as shown in FIG. 2d. The soft mask layer, in one embodiment, is a photoresist layer. The soft mask is patterned to form first and second type trench openings 251 and 253. The first and second type trench openings, in one embodiment, are deep trench openings. The first type trench opening 251 accommodates a first type DTI structure 151 and the second type trench opening accommodates a second type DTI structure 153 as described in FIG. 1a. In one embodiment, the second type trench opening 253 surrounds the first sub-region 110a and the first type trench opening 251 surrounds the second type trench opening such as that shown in FIG. 1b or 1c when viewed from top. Other suitable configurations for the first and second type trench openings may also be useful.

To form the trench openings in the mask layer, it may be selectively exposed with an exposure source using a reticle. The pattern of the reticle is transferred to the soft mask layer after exposure by a development process. In one embodiment, the width W2 of the second type trench opening 253 is less than the width W1 of the first type trench opening 251 when viewed from top. In one embodiment, the width W2 of the second type trench opening 253 corresponding to the second type DTI structure is in between the minimum critical dimension (CD) achievable by photolithography and the width W1 of first type DTI. Alternatively, the width W2 is less than 2.5 times the thickness of a subsequently formed dielectric layer which lines the sidewalls of the first type trench opening 251. For example, for a dielectric layer having a thickness T1 of about 0.3-1 μm, the width W2 of the second type trench opening may be about 0.5-2 μm. Other suitable width dimensions for the second type trench opening which is less than 2.5 times the thickness of a subsequently formed dielectric layer which lines the sidewalls of the first type trench opening may also be useful.

Referring to FIG. 2d, an etch is performed on the substrate. The etch, in one embodiment, is an anisotropic etch, such as a reactive ion etch (RIE), using the patterned soft mask layer as an etch mask. The etch forms blind vias for both the first and second type trench openings 251 and 253. The etch removes exposed portions of the hard mask, epitaxial layer, buried layer and the underlying substrate. As shown, the trench openings extend from top of the epitaxial layer, pass through the epitaxial and buried layers and into a portion of the substrate 102. Alternatively, the soft mask layer transfers the pattern to the hard mask by etching the hard mask anisotropically. Then, using the hard mask as an etch mask, blind vias corresponding to the first and second type trench openings are formed in the substrate. In one embodiment, the depth D1 of the first type trench opening 251 and the depth D2 of the second type trench opening 253 are about the same. For example, D1 and D2 are about 10-30 μm deep with respect to the top surface of the epitaxial layer. Other suitable depth dimensions may also be useful. In other embodiments, due to the different widths of the first and second type trench openings, D1 and D2 may be different. For example, the depth D2 may be less than the depth D1.

After forming the first and second type trench openings, the soft mask 216 is removed by, for example, ashing. Other suitable techniques may also be used to remove the soft mask. The hard mask 212 remains after the removal of the soft mask.

As shown in FIG. 2e, a dielectric layer 152 is formed on the substrate. In one embodiment, the dielectric layer 152 lines the sidewalls and bottom of the first type trench opening 251 and surface of the substrate (hard mask layer) as well as filling the second type trench opening 253 to form the second type DTI structure 153. The thickness T1 of the dielectric layer 152, for example, should be sufficient to line the sidewalls of the first type DTI structure and to completely fill the second type trench opening 251 to form the second type DTI structure 153 to provide further isolation for HV devices. The thickness of the dielectric layer 152, for example, should also be sufficient to sustain the highest voltage between second type buried layer and the first type DTI structure. For example, the second type buried layer 104 is connected to $V_{DD}$ while the first type DTI structure 151 is connected to the first polarity type substrate and $V_{SS}$. The dielectric layer, for example, is a silicon oxide layer formed by, for example, CVD. Other suitable dielectric materials and forming techniques may also be employed.

An anisotropic etch, such as RIE, may be performed to remove horizontal portions of the dielectric layer, leaving portions of the dielectric layer 152 lining on the sidewalls of the first type trench opening 251 and patterned hard mask 212 as well as portions filling the second type trench opening 253 as shown in FIG. 2f. As shown, the bottom of the first type trench opening 251 is exposed.

A conducting material 154 is provided on the substrate and fills the first type trench opening 251. The conducting material, for example, may be a polysilicon layer. The polysilicon layer, for example, may be highly doped with first polarity type dopants. For example, the polysilicon layer may be a highly p-doped polysilicon layer. The conducting material may be formed by, for example, CVD. Other suitable materials and techniques may be used for the conducting material. Excess conducting material may be removed by chemical mechanical polishing (CMP) process, followed by an etch back process.

Figure 2G:
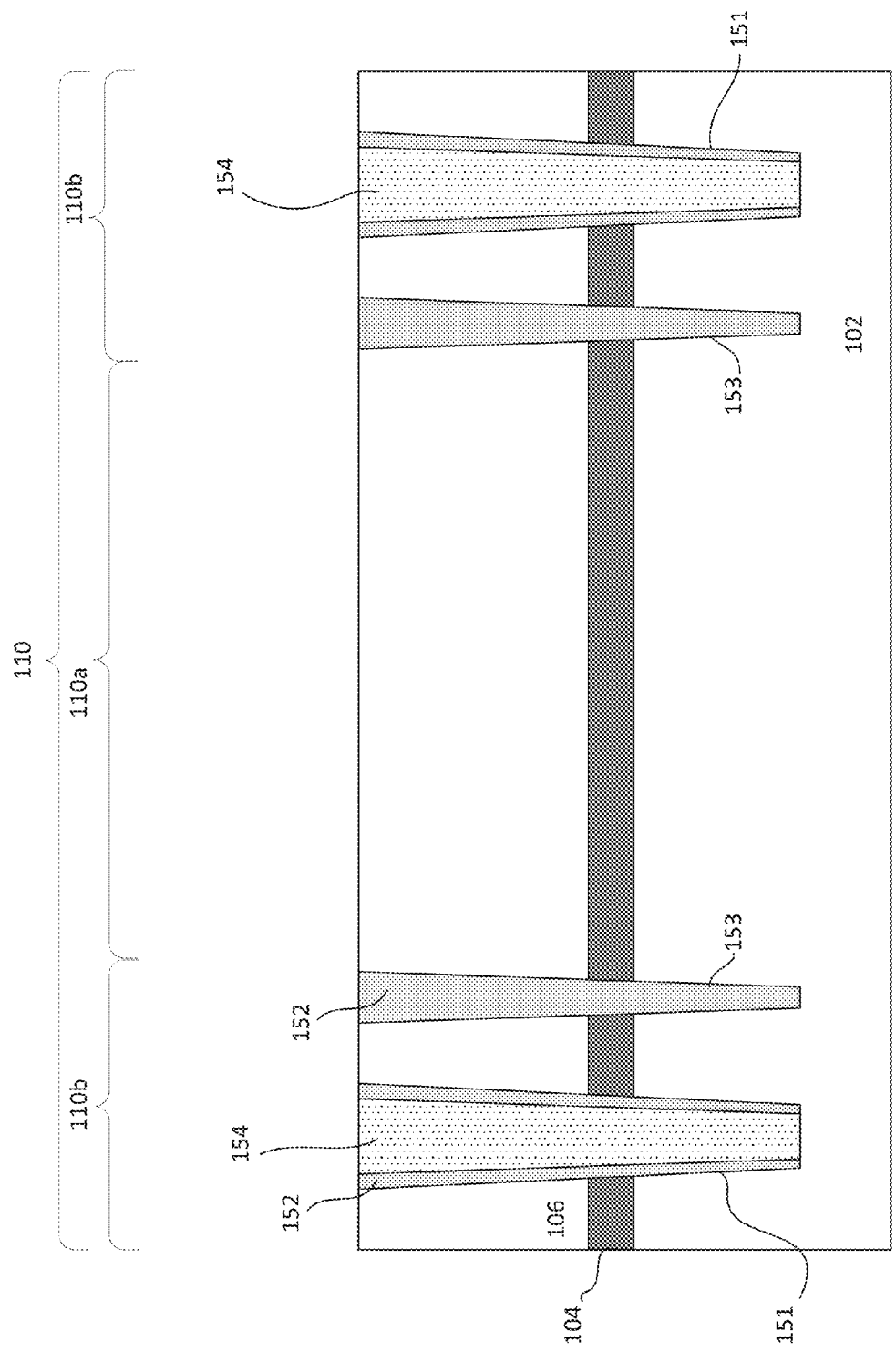

The process also removes the hard mask 212. In one embodiment, the pad nitride layer is removed by, for example, a wet etch selective to the pad oxide layer and materials of the DTI structures. Other suitable techniques of removing the hard mask may also be useful. A stripping process may be performed to remove the remaining pad oxide layer to expose the top surface of the substrate. The pad oxide layer, for example, may be removed by a wet etch process, such as HF. Other suitable techniques may be employed for the stripping process. This completes the formation of the first type DTI structure 151 and the top surface of the first and second type DTI structures 151 and 153 are substantially coplanar with top surface of the substrate as shown in FIG. 2g. The first type DTI structure 151 is configured to also serve as a pick up structure providing low conductivity path to connect the substrate to upper metal interconnect while the second type DTI structure 153 is configured to further isolate the HV devices from other regions.

The contacts plugs, for example, are coupled to contact regions of the LDMOS transistors. The process continues to complete forming the device. For example, additional processes may be performed to complete the device. Such processes may include forming other transistors in other device regions and additional interconnect metal levels, final passivation, dicing, packaging and testing.

We have conducted an experiment to measure the performance of the device as described in FIG. 1a. The results of the experiment are shown in Table 1 below.

TABLE 1

| Isolation Scheme | Depth of First Type DTI structure | Depth of Second Type DTI structure | Dielectric thickness on sidewall of First Type DTI structure | Isolation width of First Type DTI structure | Isolation width of Second Type DTI structure | Thermal Budget | Breakdown Voltage |
|---|---|---|---|---|---|---|---|
| Embodiment (FIG. 1a) | D1 | D1 | T1 | W1 | W2 | TB1 | >120 |
| Embodiment (FIG. 1a) | D1 | D1 - 4 μm | T1 | W1 | W2 | TB1 | >120 |

As described, the first and second type trench openings for accommodating the first and second type DTI structures are formed simultaneously using the same mask and the second type trench opening is filled with the same dielectric layer which lines the sidewalls of the first type trench opening. This simplifies the process and do not require additional mask to form the second type trench opening. In other embodiments, the second type trench opening may be formed in a separate step and may be filled with other suitable types of dielectric material.

The process continues to form isolation regions in the epitaxial layer, such as STI regions 180 as shown in FIG. 2h. Various processes can be employed to form the STI regions. For example, the substrate can be etched using etch and mask techniques to form isolation trenches which are then filled with dielectric materials such as silicon oxide. CMP can be performed to remove excess oxide and provide a planar substrate top surface. Other processes or materials can also be used to form the STI regions 180 having depth dimensions such as that described in FIG. 1a. As shown in FIG. 2h, device or transistor wells 114 and drift well 112 are defined in the first sub-region 110a using suitable ion implantation techniques. The device well serves as a body well for a transistor.

The process continues to form HV transistors on the substrate. For example, the process continues to form various elements of the HV transistors. For illustration purpose, the process continues to complete formation of HV transistors, such as first and second LDMOS transistors 140 as shown in FIG. 2h. It is understood that other suitable number of LDMOS transistor and other suitable types of HV transistors may be formed. The process to form the LDMOS transistors, for example, includes forming gates, sidewall spacers adjacent to the gate sidewalls and source/drain regions 132 and 134 of the HV transistors. Various suitable techniques to form elements of the LDMOS transistors may be employed and will not be described in detail. The process may continue to form metal silicide contacts on exposed substrate regions, followed by forming a dielectric layer (not shown) which serves as a PMD layer on the substrate, covering the transistors and top surface of the substrate. Contact plugs (not shown) may be formed in the PMD layer.

As shown in Table 1 above, the breakdown voltage is greatly enhanced by providing the first and second type DTI structures as described in FIGS. 1a-1c and FIGS. 2a-2h relative to conventional isolation schemes. For example, breakdown voltage of more than 120 V is achieved by the provisions of the DTI structures as described. In addition, for similar breakdown voltage, conventional isolation schemes require deeper trench openings and thicker sidewalls dielectric liner which complicates the manufacturing process and may undesirably result in high thermal budget affecting the reliability of the device and increases the manufacturing costs.

The embodiments as described in FIGS. 1a-1c and FIGS. 2a-2h result in advantages. The provision of the first and second type DTI structures avoid latch up problem, effectively isolates the high voltage transistors from other device regions and further enhances the breakdown voltage. For example, we have observed that a breakdown voltage of greater than 120 V is achieved by providing the second type DTI structure as described. For example, the provision of the second type DTI effectively increases the dielectric layer thickness and can help in dividing the voltage drop between the first and second DTI structures for higher sustainable voltage. In addition, the provision of the first and second type DTI structures consume smaller layout area and requires less number of masks compared to conventional junction isolation scheme. Moreover, as described in FIGS. 2a-2h, the first and second type trench openings are formed simultaneously using the same mask and the second trench opening is filled in the same step as the dielectric layer formation over the sidewalls of the first type trench opening for the first type DTI structure. Thus, no additional or special mask is needed to form the second type DTI structure. As described, the HV device regions are provided with the first and second type DTI structures while other regions, such as LV or MV device regions are provided with the first type DTI structures. Therefore, the embodiments as described provide flexibility as the second type DTI structure may be introduced into any device regions where enhanced isolation is needed without affecting other device regions. Furthermore, the process as described in FIGS. 2a-2h allows thinner sidewall dielectric layer and shallower trench depth to be formed compared to conventional isolation schemes for the same isolation or breakdown voltage level. Also, the first and second type trench openings for accommodating the first and second type DTI structures are easy to fabricate due to less thermal budget, shallower trench depth and thinner sidewall dielectric layer. Especially for the sidewall layer thickness, it is very difficult to further increase in a deep trench after it reaches a particular thickness.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
providing a base substrate with lightly doped first polarity type dopants;
forming a buried layer with heavily doped second polarity type dopants in a top portion of the base substrate;
forming an epitaxial layer over the buried layer;
forming first and second type deep trench isolation (DTI) structures which extend from a top surface of the epitaxial layer through the buried layer and to a portion of the base substrate to isolate different device regions defined in the base substrate, wherein the first and second type DTI structures have different width dimensions;
forming shallow trench isolation (STI) regions in the epitaxial layer, the STI regions extend from the top surface of the epitaxial layer and terminate within the epitaxial layer, wherein the STI regions and DTI structures are discontiguous features, the STI regions and DTI structures have planar top surfaces which are coplanar with the top surface of the epitaxial layer; and
forming at least one transistor on the epitaxial layer.

2. The method of claim 1 wherein forming the first and second type DTI structures comprises forming first and second type trench openings having different width dimensions through the epitaxial layer and into a portion of the base substrate.

3. The method of claim 2 wherein the second type trench opening comprises a width W2 which less than a width W1 of the first type trench opening.

4. The method of claim 2 wherein the first type trench opening comprises a depth D1 and the second type trench opening comprises a depth D2, wherein D2 is about the same as D1.

5. The method of claim 2 wherein the first type trench opening comprises a depth D1 and the second type trench opening comprises a depth D2.

6. The method of claim 2 wherein the first and second type trench openings are formed simultaneously using a same mask.

7. The method of claim 6 wherein forming the first and second type DTI structures comprises:
forming a dielectric layer lining sidewalls and bottom of the first type trench opening, wherein the same dielectric layer also fills the second type trench opening to form the second type DTI structure;
performing an etch to remove portion of the dielectric layer which lines the bottom of the first type trench opening; and
providing a conducting material to fill the first type trench opening.

8. The method of claim 7 wherein the conducting material comprises a polysilicon layer highly doped with first polarity type dopants.

9. The method of claim 7 wherein forming the first and second type DTI structures comprises:
performing a chemical mechanical polishing (CMP) to remove excess conducting material; and
performing an etch back process such that the conducting material comprises a substantially coplanar top surface with the top surface of the epitaxial layer.

10. The method of claim 1 wherein forming the buried layer comprises:
performing a blanket second polarity type ion implantation to form a substantially continuous second polarity type buried layer in the top portion of the base substrate.

11. The method of claim 1 wherein the base substrate comprises a device region having a first sub-region for accommodating one or more transistors and a second sub-region for accommodating the first and second type DTI structures, wherein the first sub-region is formed in the center of the device region, the second type DTI structure surrounds the first sub-region and the first type DTI structure is disposed in the outermost region of the device region and surrounds the second type DTI structure.

12. The method of claim 11 wherein the first and second type DTI structures form substantially rectangular concentric ring structures which surround the first sub-region when viewed from top.

13. The method of claim 11 wherein the first and second type DTI structures form substantially circular concentric ring structures which surround the first sub-region when viewed from top.

14. A device comprising:
a base substrate with lightly doped first polarity type dopants;
a buried layer with heavily doped second polarity type dopants disposed in a top portion of the base substrate;
an epitaxial layer disposed over the buried layer;
first and second type deep trench isolation (DTI) structures disposed in the base substrate, wherein the first and second type DTI structures extend from a top surface of the epitaxial layer through the buried layer and to a portion of the base substrate to isolate different device regions defined in the base substrate, wherein the first and second type DTI structures have different width dimensions;
shallow trench isolation (STI) regions disposed in the epitaxial layer, the STI regions extend from the top surface of the epitaxial layer and terminate within the epitaxial layer, wherein the STI regions and DTI structures are discontiguous features, the STI regions and DTI structures have planar top surfaces which are coplanar with the top surface of the epitaxial layer; and
at least one transistor disposed on the epitaxial layer.

15. The device of claim 14 comprising first and second type trench openings having different width dimensions in the base substrate, wherein the first and second type trench openings accommodate the first and second type DTI structures and pass through the epitaxial layer and into a portion of the base substrate.

16. The device of claim 15 wherein the second type trench opening comprises a width W2 which less than a width W1 of the first type trench opening.

17. The device of claim 15 wherein the first type trench opening comprises a depth D1 and the second type trench opening comprises a depth D2.

18. The device of claim 15 wherein the first and second type trench openings comprise:
- a dielectric layer which lines at least sidewalls of the first type trench opening, wherein the same dielectric layer also fills the second type trench opening to form the second type DTI structure; and
- a conducting material which fills the first type trench opening to form the first type DTI structure.

19. The device of claim 14 wherein the first and second type DTI structures are disposed in a high voltage (HV) device region of the base substrate and the at least one transistor is a HV transistor.

20. The device of claim 19 wherein the HV device region comprises a first sub-region for accommodating the HV transistor and a second sub-region for accommodating the first and second type DTI structures, wherein the first sub-region is disposed in the center of the HV device region, the second type DTI structure surrounds the first sub-region and the first type DTI structure is disposed in the outermost region of the HV device region and surrounds the second type DTI structure.

21. The device of claim 20 wherein the first and second type DTI structures form substantially rectangular concentric ring structures which surround the first sub-region when viewed from top.

22. The device of claim 20 wherein the first and second type DTI structures form substantially circular concentric ring structures which surround the first sub-region when viewed from top.

* * * * *